United States Patent
Zipper et al.

(10) Patent No.: US 7,095,281 B2
(45) Date of Patent: Aug. 22, 2006

(54) DIFFERENTIAL AMPLIFIER ARRANGEMENT WITH CURRENT REGULATING CIRCUIT AND METHOD FOR OPERATING A DIFFERENTIAL AMPLIFIER ARRANGEMENT

(75) Inventors: Josef Zipper, Linz (AT); Werner Schelmbauer, Linz (AT); Claus Stöger, Linz (AT)

(73) Assignee: Infineon Technologies Ag, Munich (DE)

( * ) Notice: Subject to any disclaimer, the term of this patent is extended or adjusted under 35 U.S.C. 154(b) by 13 days.

(21) Appl. No.: 10/949,432

(22) Filed: Sep. 24, 2004

(65) Prior Publication Data

US 2005/0099233 A1 May 12, 2005

(30) Foreign Application Priority Data

Sep. 26, 2003 (DE) ................. 103 44 878

(51) Int. Cl.
*H03F 3/45* (2006.01)
(52) U.S. Cl. .................. 330/261; 330/253; 330/258
(58) Field of Classification Search ............. 330/261, 330/253, 258
See application file for complete search history.

(56) References Cited

U.S. PATENT DOCUMENTS

| | | | |
|---|---|---|---|
| 3,803,505 A | | 4/1974 | Ishigaki et al. |
| 5,475,323 A | * | 12/1995 | Harris et al. .................. 327/67 |
| 5,587,687 A | * | 12/1996 | Adams ........................ 330/253 |
| 6,137,362 A | * | 10/2000 | Dufossez .................... 330/254 |
| 6,466,061 B1 | * | 10/2002 | Popescu et al. ............. 327/108 |
| 6,583,661 B1 | * | 6/2003 | Tanji et al. .................. 327/355 |

FOREIGN PATENT DOCUMENTS

EP 0 511 707 B1 11/1992

OTHER PUBLICATIONS

"Halbleiterschaltungstechnik", Tietze et al., Springer Publishing, 2002, Chapter 4.1.3, 31 pgs.
"A Universal Dual Band LNA Implementation in SiGe Technology for Wireless Applications", Axel Schmidt and Stephane Catala, IEEE Journal of Solid State Circuits, vol. 36, No. 7, Jul. 2001, pp. 1127-1131.

(Continued)

*Primary Examiner*—Patricia Nguyen
(74) *Attorney, Agent, or Firm*—Eschweiler & Associates, LLC

(57) ABSTRACT

Provision is made of a differential amplifier arrangement with a current source (S1), two controllable paths (T1, T2), which are in each case coupled by one terminal to the current source (S1) and the control terminals of which form the input of the differential amplifier arrangement. Via a respective cascode circuit (K1, K2), a load (L1, L2) is respectively connected to the first and second controllable paths (T1, T2). At least one tap (A1) between one of the loads and one of the cascode circuits forms an output of the differential amplifier arrangement. Provision is made of a comparison means (D1) having two inputs, which is designed for outputting a control signal dependent on a comparison. A first input is coupled to the first tap (A1) and the second input is designed for feeding a reference signal. Furthermore, the differential amplifier arrangement contains a regulable current source (G1), the control input of which is connected to the output of the comparison means and the current output of which is connected to the second terminal (P1) of at least the first controllable path (T1).

19 Claims, 5 Drawing Sheets

OTHER PUBLICATIONS

"A Dual-Band RF Front-End for WCDMA and GSM Applications", Jussi Ryynänen, Kalle Kivekäd, Jarkko Jussila, Aarno Pärssinen and Kari A. I. Halonen, IEEE Journal of Solid Stte Circuits, vol. 36, No. 8, Aug. 2001 pp. 1198-1204.

"A New Design Aproach for Variable-Gain Low Noise Amplifiers", S. Pennisi, S. Scaccianoce, and G. Palmisano, IEEE Radio Frequency Integrated Circuit Symposium, 2000, 4 pgs.

"Dual-Band High-Linearity Variable-Gain Low-Noise Amplifiers for Wireless Applications", Keng Leong Fong, IEEE International Solid State Circuits Conference, 1999, 11 pgs.

\* cited by examiner

US 7,095,281 B2

DIFFERENTIAL AMPLIFIER ARRANGEMENT WITH CURRENT REGULATING CIRCUIT AND METHOD FOR OPERATING A DIFFERENTIAL AMPLIFIER ARRANGEMENT

REFERENCE TO RELATED APPLICATION

This application claims the benefit of the priority date of German application DE 103 44 878.0, filed on Sep. 26, 2003, the contents of which are herein incorporated by reference in their entirety.

FIELD OF THE INVENTION

The invention relates to a differential amplifier arrangement with a current regulating circuit. The invention furthermore relates to a method for operating a differential amplifier arrangement.

BACKGROUND OF THE INVENTION

In receiving devices, a low-noise amplifier is usually situated such that it is connected directly downstream of the receiving antenna. Its task is to amplify an input signal received by the antenna. In this case, the amplifier is intended to have only a low inherent noise in order thus to have a good signal/noise ratio. In addition to the requirement for a low noise figure, a switchable gain is likewise desirable. This switchable gain is called "gain step". This prevents amplification of input signals with very high levels which overdrive the downstream signal-processing switching elements and thus cause signal distortions. In the case of such switchable gains, however, the accuracy that can be achieved is problematic since most circuit concepts have a different operating point depending on the gain. Changing the operating point in a manner dependent on the switchable gain reduces the accuracy of the "gain step".

A further requirement is a so-called dual band combination. In this case, the receiver device is designed for the reception and the processing of signals which lie in two different frequency bands. Generally, the two frequency bands lie in the spectrum in a range which cannot be covered by a normal low-noise amplifier. In particular, CMOS amplifiers have the required impedance for matching in only a very narrow frequency range, so that the two frequency bands are not covered with just one CMOS amplifier. It is therefore expedient to provide a respective amplifier for each frequency band and to combine them in a suitable manner within the signal processing chain.

However, such combination is always associated with additional parasitic signals that influence the performance of the receiver. On the other hand, by contrast, combining the two frequency bands at a suitable location makes it possible to save chip area and thus to reduce the costs.

A further problem is improving the signal/noise ratio in low-noise amplifiers. The latter usually use field-effect transistors as input transistors IN and INX. One example of a known amplifier can be seen in FIG. 7. A similar differential amplifier is described in Tietze/Schenk "Halbleiter-Schaltungstechnik", ["Semiconductor circuitry"], 12th Edition, Springer Verlag 2002, in Chapter 4.1.3. In order to improve the ratio at the input transistors, it is necessary to maximize the bias current flowing through the transistors. However, the use of normal nonreactive load resistors instead of the coils L1 and L2 illustrated in the example leads to a higher voltage drop across the load resistors in the case of a large DC current. As a result, the voltage range available for the transistors IN and INX is reduced and the voltage swing of the output signal OUT is reduced. It is therefore additionally necessary to increase the supply voltage, which, however, leads to additional power losses.

For this reason, an inductive load having a low quality factor is very often used instead of nonreactive load resistors. However, such an on-chip inductance requires a very large area on the chip and thus enlarges the receiver unit in a disadvantageous manner.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides a differential amplifier arrangement that can have an improved signal/noise ratio even in conjunction with a relatively small chip area. Furthermore, the present invention includes a method for operating such a differential amplifier arrangement.

In accordance with an aspect of the present invention, a differential amplifier arrangement according to the invention comprises a first DC current source and also a first and a second controllable path. A first terminal of the first and second controllable paths is in each case coupled to the DC current source. The control terminals of the first and second controllable paths are in each case connected to an input of the differential amplifier arrangement. A first and a second load are provided, which are in each case coupled by one terminal via a respective cascode circuit to a respective second terminal of the first and second controllable paths. The respective other terminal of the first and second loads is designed for feeding a supply potential. Furthermore, the differential amplifier arrangement has a first tap between the first load and the first cascode circuit and also a second tap between the second load and the second cascode circuit. The two taps are in each case connected to an output of the differential amplifier arrangement and form the output for an output signal.

In accordance with another aspect of the invention, a differential amplifier arrangement includes a comparison mechanism and/or circuit. The comparison mechanism has a first and a second input and is designed for outputting a signal dependent on a comparison of two signals applied on the input side. The first input of the comparison means is coupled to first and second taps. The second input of the comparison means is designed for feeding a reference signal. Furthermore, at least one first current source that can be regulated by a control signal is provided, the control input of which is connected to the output of the comparison means and the output of which for a current signal is coupled to the second terminal of at least the first controllable path.

In yet another aspect of the invention, a differential amplifier arrangement is furthermore designed with nonreactive resistors as load or as current sink. These have only a small area and can be realized in highly space-saving fashion. In order that the voltage drop across the first and second loads is nevertheless small and a sufficiently large voltage signal is thus generated at the two output taps, a part of the DC bias current is switched out upstream of the first and second loads by the first regulable current source. The control of the quantity of current switched out by the regulable current source is provided by the common-mode current regulation of the comparison means. As a result, a regulating circuit is formed which keeps the output potential at the output of the differential amplifier constant by changing the DC current. A reliable operation of the first and second controllable paths is thus provided. The high current that continues to flow through the input transistors produces a relatively good signal/noise ratio. The supply voltage does not have to be increased since only the difference comprising the DC bias current through the signal transistors minus the switched-out part flows through the load. At the same time, the voltage swing of the output signal is sufficiently large.

In accordance with another aspect of the present invention, a method of operating a differential amplifier arrangement is provided. In the method, the output signals are determined in common-mode fashion and compared with a reference signal. A control signal is generated from such a comparison and is used to control a DC current of a regulable current source. The DC current is fed to the differential amplifier arrangement between the load and the input transistor.

In this method, a part of the DC current of the differential amplifier arrangement is switched out in a suitable manner, thereby establishing a lower voltage drop across the load. This significantly improves the signal/noise ratio of the differential amplifier arrangement without enlarging the chip area required by the differential amplifier arrangement.

In accordance with another aspect of the invention, a second current source is provided that can be regulated by the control signal, a control input of the second regulable current source being connected to the output of the comparison mechanism and the current output of the second controllable current source being connected to the second terminal of at least the second controllable path. As a result, it is possible to realize a symmetrical differential amplifier arrangement which is advantageously used in particular for differential signal processing.

In accordance with yet another aspect of the invention, the coupling of the first input of the comparison mechanism to the first and second taps comprises a further tap between the terminals of a third and a fourth load. Another terminal of the third load is connected to the first tap and another terminal of the fourth load is connected to the second tap of the differential amplifier arrangement. As a result, the first and second taps are coupled to one another via the third and fourth loads. The output potential of the differential amplifier arrangement is applied via the third and fourth loads, in common-mode fashion, to the input of the comparison means, which can impair the signal with a reference potential. In this connection, the comparison means is formed by means of a differential amplifier having a first and a second output. The first and second loads and/or the third and fourth loads can optionally constitute a nonreactive resistor.

In another aspect of the present invention, provision is made of a third and a fourth controllable path, which are in each case coupled by a first terminal to a second DC current source. The control terminals of the third and fourth controllable paths in each case form a further input of the differential amplifier arrangement. The second terminal of the third controllable path is coupled to the second terminal of the first controllable path and the second terminal of the fourth controllable path is coupled to the second terminal of the second controllable path.

This aspect realizes a differential amplifier arrangement having in each case two inputs for, in particular, two different frequencies. It is expedient, therefore, to optimally tune the first and second controllable paths and/or the third and fourth controllable paths for input signals at the desired frequency. This aspect therefore realizes an input amplifier for a dual band combination. This concept can be extended in a simple manner by in each case another two controllable paths being coupled to a current source, on the one hand, and to the respective second terminal of the first and second controllable paths, on the other hand.

In yet another aspect of the present invention, the first and second DC current sources are the respective same DC current source.

In another aspect of the present invention, provision is made of a fifth controllable path and a third cascode circuit connected in series therewith, and of a sixth controllable path and a fourth cascode circuit connected in series therewith. The first terminal of the fifth and sixth controllable paths is connected to the first DC current source. The first tap is coupled to the third cascode circuit and the second tap is coupled to the fourth cascode circuit. The control terminals of the fifth and sixth controllable paths are connected to the control terminal of the first and second controllable paths, respectively.

In this aspect, the differential amplifier arrangement according to the invention in each case contains a further cascode circuit, which thereby realizes a switchable gain in a simple manner. The design with an additional fifth and sixth controllable path, the control terminals of which are respectively connected to the first and second controllable paths, means that the operating point is not changed during operation of the differential amplifier arrangement even with the cascode circuit switched on. Different accurate gains can be realized as a result.

In yet another aspect of the present invention, a fifth cascode circuit is connected by a first terminal between the fifth controllable path and the third cascode circuit and is connected by a second terminal to the second tap. A sixth cascode circuit is connected by its first terminal between the sixth controllable path and the fourth cascode circuit and is connected by a second terminal to the first tap. As a result, a further gain stage is realized, the two gain stages each having a different gain. It is particularly expedient if the input resistances of the first and fifth controllable paths have the same ratio as the input resistances of the first and third cascode circuits. The accuracy of the gain stage can be increased further as a result.

BRIEF DESCRIPTION OF THE DRAWINGS

The invention is explained in detail below on the basis of various exemplary embodiments with the aid of the drawings, in which.

DETAILED DESCRIPTION OF THE INVENTION

Figure 1:
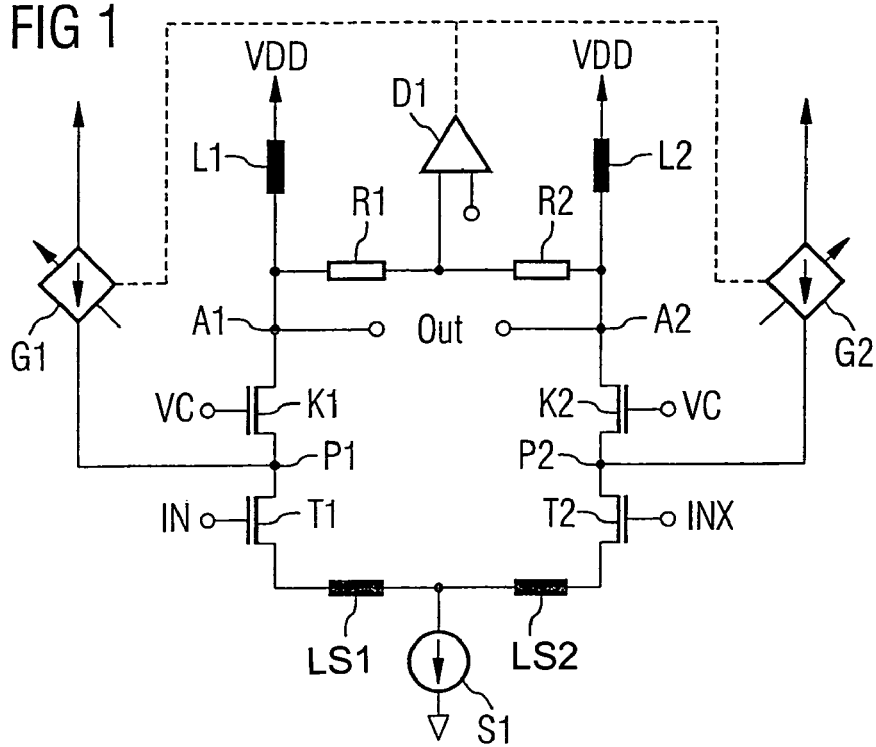
FIG. 1 shows a first aspect of the present invention.

FIG. 1 is a schematic diagram of a differential amplifier arrangement having a common-mode current regulation in accordance with an aspect of the present invention.

A DC current source S1 is connected via a coil LS1 to the source terminal of a field-effect transistor T1 of the n-channel type. A further source terminal of a second field-effect transistor T2 is likewise connected via a coil LS2 to the current source S1. The coils LS1 and LS2 serve for matching the two transistors T1 and T2. The control terminals of the field-effect transistors T1 and T2 form the inputs of the differential amplifier arrangement. They are designed for feeding the differential input signal IN and INX, respectively. The drain terminal of the first signal transistor T1 is connected to the source terminal of a second transistor K1 and also to the output of a regulable current source G1. The drain terminal of the transistor T2 is connected to the source terminal of a fourth transistor K2 and to the output of a second regulable current source G2. The two field-effect transistors K1 and K2 with an n-channel type in each case form a cascode circuit, the drain terminals or outputs of which lead to the taps A1 and A2, respectively.

The two taps A1 and A2 form the output of the differential amplifier arrangement. Furthermore, the tap A1 is connected to a first load L1 and to a second load R1. A third load L2 and a fourth load R2 are connected to the tap A2. The two loads L1 and L2 are nonreactive resistors and form current sinks, the supply potential VDD being fed to their respective other terminal. The two loads R1 and R2 are likewise nonreactive resistors and connected to one another. Between the nonreactive resistors R1 and R2, a tap leads to a first input of a differential amplifier D1. The second input of the differential amplifier D1 is connected to an input to which a supply potential VREF is fed. As illustrated in the dashed line, the output of the differential amplifier D1 is connected to a control input of the regulable current source G1 and G2. The output of the current source G1 is connected between drain terminal of the input transistor T1 and source terminal of the cascode circuit K1, and the output of G2 is connected between drain terminal of the input transistor T2 and source terminal of the cascode circuit K2.

During operation of the differential amplifier arrangement, the noise figure of the two input field-effect transistors T1 and T2 is intended to be relatively low in order to provide a sufficient signal/noise ratio. This requires a relatively high bias current or a high DC bias current by means of the current source S1. However, a high DC bias current that flows through the two signal transistors T1 and T2 and their associated cascode circuits K1 and K2 generates a relatively high voltage drop across the load resistor L1 and L2, respectively. This reduces the voltage swing at the two taps A1 and A2 and thus at the output of the differential amplifier arrangement.

As shown in FIG. 1, a regulable current source G1 and G2 is connected between the cascode circuit K1 and K2, respectively, and the signal transistors T1 and T2, respectively. The regulable current source discharges a part of the DC bias current flowing through the signal transistors T1 and T2. This reduces the current flowing via the two current sinks L1 and L2 and the voltage drop across the two resistors L1 and L2 becomes correspondingly lower. The small-signal current generated by the two input signals IN and INX at the signal transistors T1 and T2 flows in its entirety through the two load resistors L1 and L2. The latter generate a small-signal output voltage corresponding to the gain at the taps A1 and A2.

The DC bias current that is switched out by the regulable current sources G1 and G2 is regulated by the control signal at the output of the differential amplifier circuit D1. For this purpose, in a common-mode regulation, the output potential is measured, in common-mode fashion, at the two taps A1 and A2 through the resistors R1 and R2. In the operational amplifier D1, this potential is compared with a reference potential VREF and a control signal is generated which drives the current sources G1 and G2 correspondingly. As a result, the quantity of DC current is switched out by the current sources G1 and G2 until the common-mode potential across the two resistors R1 and R2 is equal to the reference potential VREF. Ultimately, by changing the reference potential, it is also possible to control the voltage swing of the output signal of the differential amplifier according to the invention. DC current fluctuations through the current source S1 can also be compensated for by the regulable current sources G1 and G2. Furthermore, it is also possible to compensate for the bias current fluctuations of a constant gm bias circuit.

Overall, a very high DC bias current flows through the two signal transistors T1 and T2, which enables a very good signal/noise ratio, a high voltage swing at the same time being generated at the two taps A1 and A2. The current through the resistors L1 and L2 is nevertheless low. The operational amplifier D1 and the two current sources thus constitute a regulating circuit for the DC bias current flowing through the cascode switches K1 and K2.

The differential amplifier arrangement according to the invention can be combined with further circuits in a simple manner in order, for example, to enable an amplifier with a switchable gain or a dual band combination. A simple amplifier without common-mode current regulation with a dual band combination in accordance with an aspect of the present invention can be seen in FIG. 6.

The latter enables the reception of an input signal in two different frequency bands, a shared load resistor being used for the amplifier arrangement. In this case, the frequency band is selected by means of the complete switch-off, in terms of DC current, of an amplifier chain. Identical components bear identical reference symbols in this case.

Figure 6:
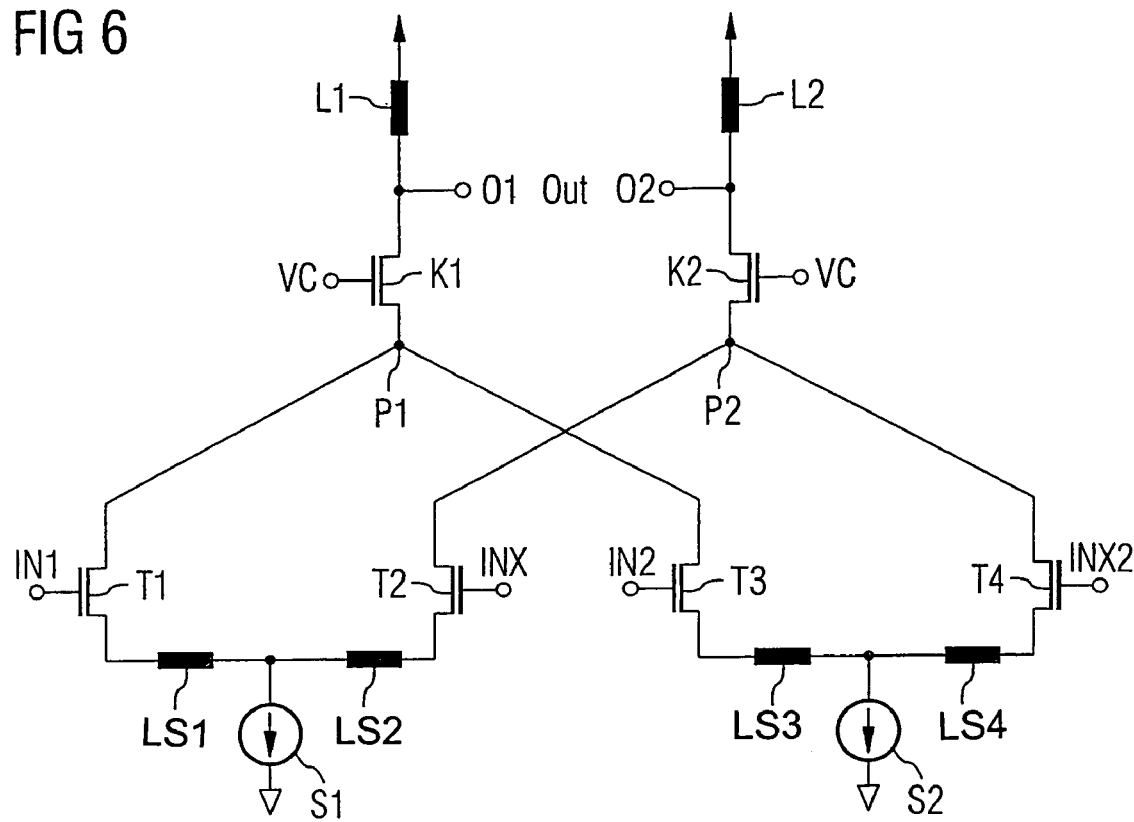
FIG. 6 shows a differential amplifier circuit for a dual band combination in accordance with an aspect of the present invention.
Figure 7:
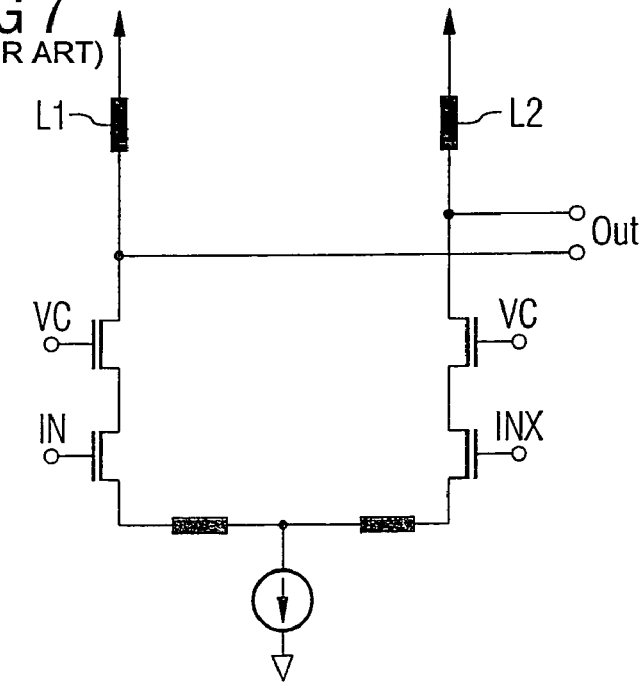
FIG. 7 shows a known differential amplifier circuit.

Two further signal transistors T3 and T4 are provided in this circuit in accordance with FIG. 6. Their two control terminals form two further inputs for the signal on the second frequency band. Their source terminals are in each case connected via a coil to a second DC current source S2. The drain terminal of the third field-effect transistor T3 is connected to the drain terminal of the first field-effect transistor T1 and to the source terminal of the first cascode circuit K1. The drain terminal of the fourth transistor T4 is connected to the drain terminal of the second transistor T2 and also to the source terminal of the second cascode circuit K2.

Since the cascode circuits K1 and K2 in each case have only a small input resistance, the parasitic capacitances present short-circuit only a small part of the signal current and thus reduce the gain of this arrangement only to an insignificant extent. It is expedient in this case to connect the two amplifiers as early as below the cascode switches, since this constitutes the point with the lowest resistance in the signal chain and the influence of parasitic effects on the gain is thereby significantly reduced. Moreover, chip area is additionally saved by the use.

Figure 2:
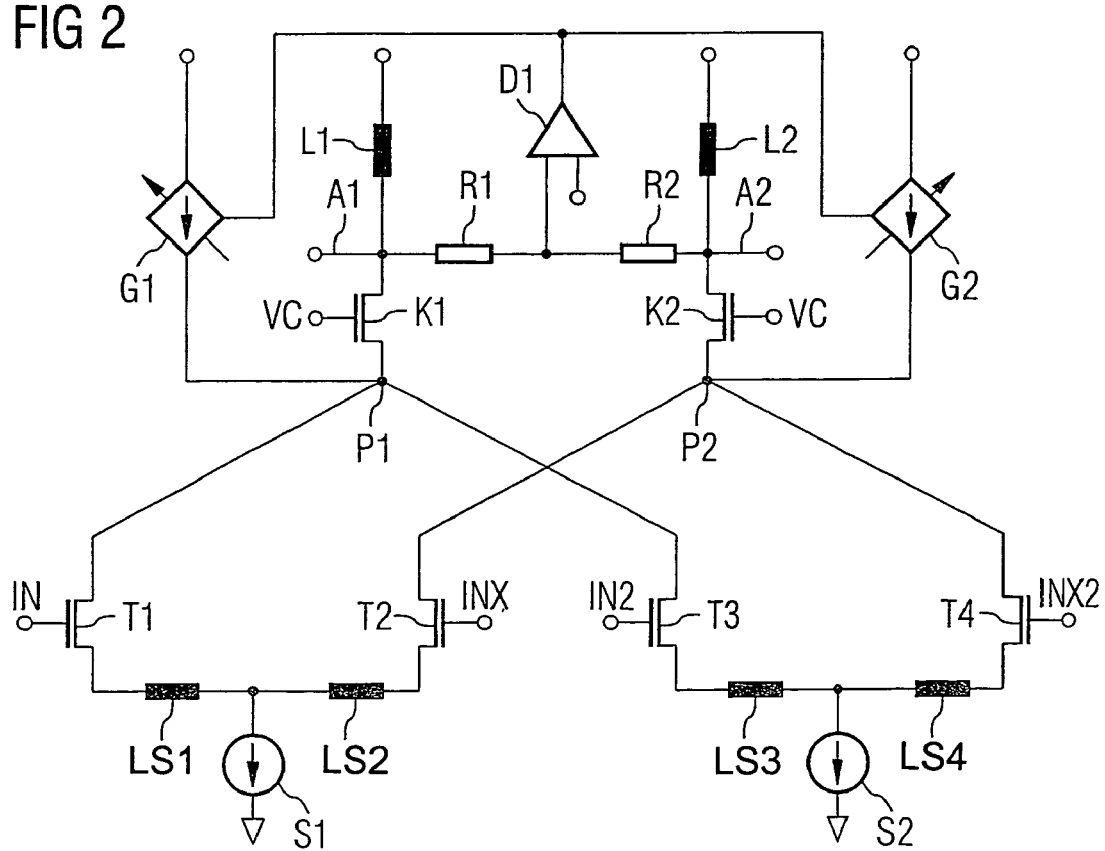
FIG. 2 shows a second aspect of the present invention.

FIG. 2 shows a combination of this dual band combination with the differential amplifier arrangement in accordance with an aspect of the present invention. The switching elements above the two nodes P1 and P2 and in particular the circuit for the common-mode current regulation are the same as those of FIG. 1. The current signal outputs of the regulable current sources G1 and G2 are connected to the source terminal of the cascode circuits K1 and K2. The switching elements below the two nodes P1 and P2 correspond to the elements of FIG. 6. The drain terminals of the signal transistors T1 and T3 are connected to the node P1, and the drain terminals of the transistors T2 and T4 are connected to the node P2. A signal path can be switched off by completing switching off one of the two DC current sources S1 or S2.

As a result of the common-mode current regulation by means of the differential amplifier D1 and the DC current sources G1 and G2, it is furthermore possible to tap off a signal at the taps A1 and A2 with a sufficiently large potential. In this case, the two current sources S1 and S2 may be designed differently and also operate with different DC bias currents. This is compensated for by the two regulable DC current sources G1 and G2, so that the same DC bias current always flows through the two load resistors L1 and L2 independently of the current intensity of the two DC current sources S1 and S2. It is conceivable, of course, to design the two DC current sources S1 and S2 as one current source. However, it is then necessary to provide switches which in each case isolate a signal path from the current source.

Another possibility includes combining the differential amplifier arrangement according to the invention with an amplifier circuit which has a switchable gain by means of a cascode changeover.

Figure 5:
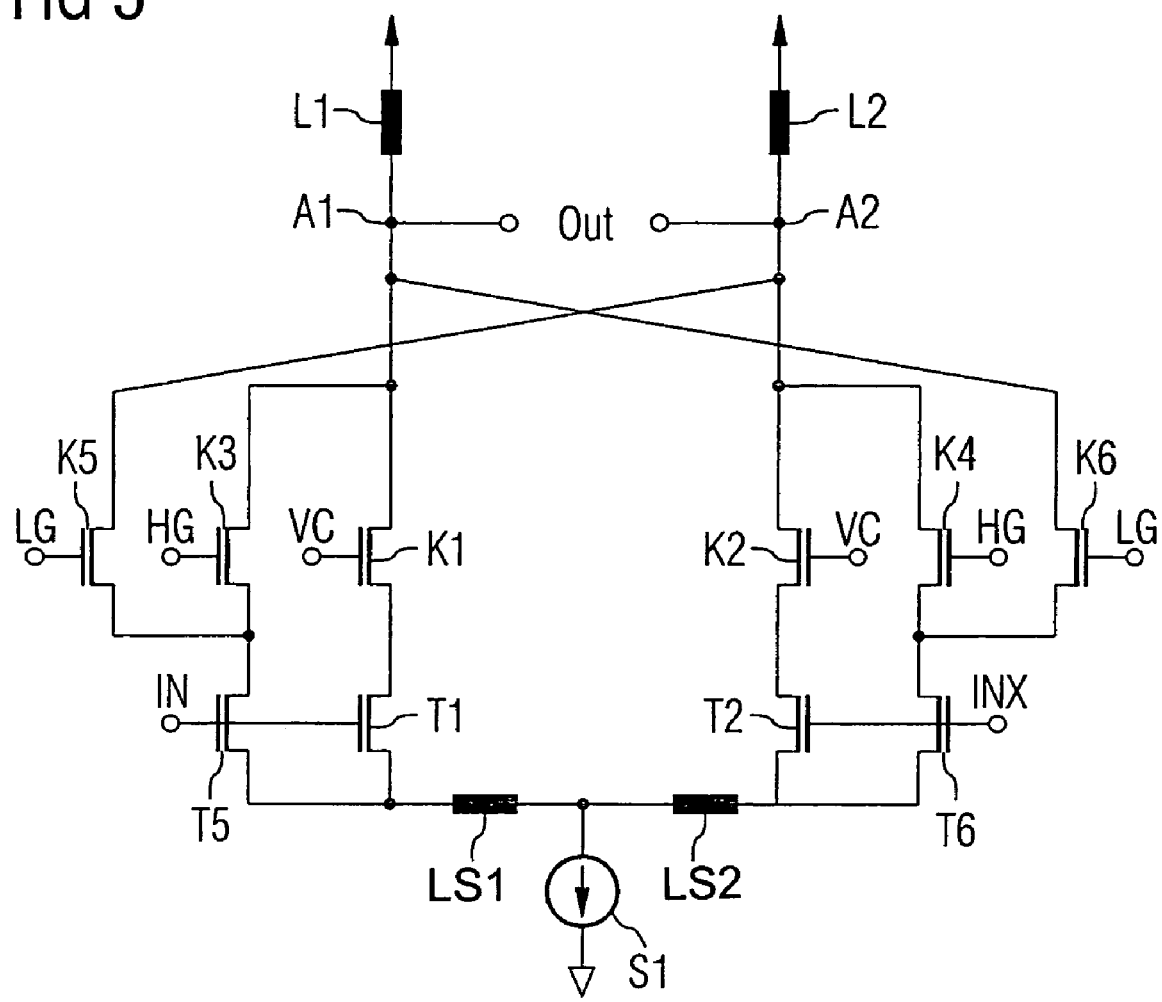
FIG. 5 shows a differential amplifier circuit with a cascode circuit in accordance with an aspect of the present invention.

A simple differential amplifier circuit without push-pull current regulation in accordance with an aspect of the present invention is provided in FIG. 5. Here, too, identical components bear identical reference symbols. In this case, the amplifier arrangement has a first signal path via a series-connected nonreactive resistor L1, a cascode circuit K1, a first signal transistor T1 and a first coil LS1 to a DC current source S1. A second signal path is provided by the nonreactive resistor L1, the cascode circuit K2 and the second signal transistor T2 and the coil LS2. In this respect, the differential amplifier arrangement is similar to the differential amplifier arrangement in accordance with FIG. 1 without the common-mode regulation.

Furthermore, a fifth and a sixth signal transistor T5 and T6 are provided, the control terminals of which are likewise connected to the input of the differential amplifier arrangement. The source terminal of the signal transistor T5 is connected to the source terminal of the first signal transistor T1, and the source terminal of the transistor T6 is connected to the source terminal of the transistor T2. The drain terminal of the signal transistor T5 is connected, on the one hand, via a third cascode circuit K3 to the tap A1 and via a fifth cascode circuit K5 to the tap A2. The signal transistor T6 is connected by its drain terminal via a fourth cascode circuit K4 to the tap A2 and via a sixth cascode circuit K6 to the tap A1. This circuit avoids the disadvantage of changing the operating point when a "gain stage" is switched on. This is effected by virtue of the fact that the input transistors T1, T5 and T2, T6 have an identical structure connected downstream for both gain stages.

The differential amplifier contains a main branch which comprises the two cascode circuits K1 and K2 and is always switched on by the control signal VC at the control input of the cascode circuits K1 and K2. Two of the four other cascode circuits K3 and K4 or K5 and K6 are then switched in depending on the gain to be generated. If the cascode circuits K3 and K4 are activated by the signal HG, the result is a constructive superposition at the tap A1 of the two small-signal currents that flow through the signal transistor T1 and through the signal transistor T5, respectively. The small-signal current that flows through the transistors T6 and T2 is likewise superposed constructively at the tap A2. This increases the gain in both signal paths.

If the transistors K5 and K6 are active, the result is an in-antiphase or destructive superposition of the two small-signal currents and the gain decreases. The two cascodes K3 and K5 or K4 and K6 within the gain step branch are of the same magnitude in this case, so that the operating point of the signal transistors T5 and T1 or T2 and T6 is not changed. The accuracy of the gain changeover can be increased further if the ratio of the input resistances of the transistors T1 and T5 is equal to the ratio of the input resistances K1 and K3.

Figure 3:
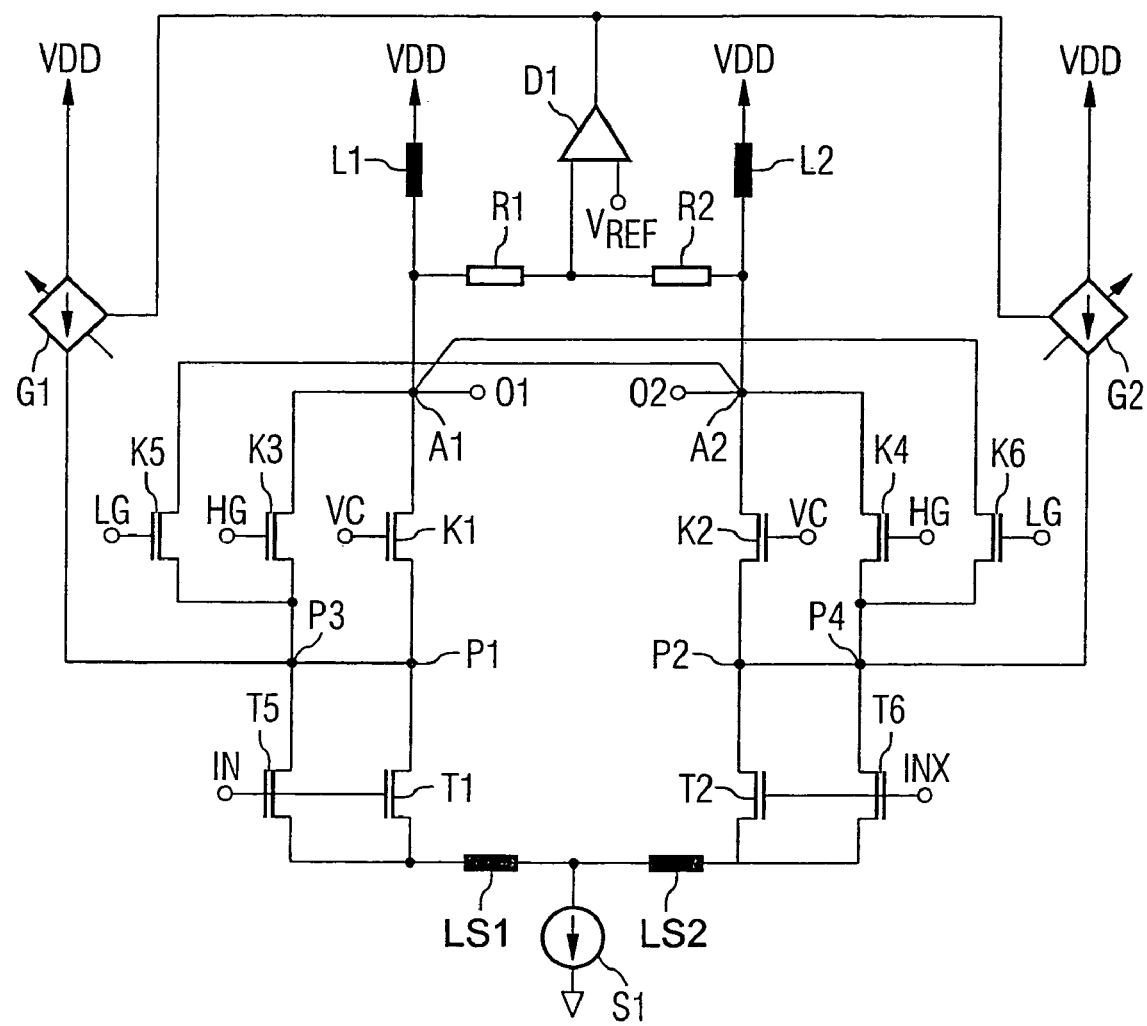
FIG. 3 shows a third aspect of the present invention.

A combination of the differential amplifier arrangement with cascode changeover in accordance with an aspect of the present invention is shown in FIG. 3. The differential amplifier arrangement is in accordance with the differential amplifier arrangement with the push-pull current regulation in accordance with FIG. 1 and FIG. 5.

Here, too, the two cascode circuits K5 and K6 are connected to the taps A2 and A1, respectively. The tap A1 is additionally connected via the drain terminal of the cascode circuit K3 to the drain terminal of the signal transistor T5. The tap A2 is connected to the drain terminal of the signal transistor T6 via the cascode circuit K4. As in the differential amplifier arrangement according to the invention in accordance with FIG. 1, the output of the regulable current source G1 and G2 is connected between the cascode circuit K1 and the signal transistor T2 at the point P1 and, respectively, between the cascode circuit K2 and the signal transistor T2 at the point P2. Furthermore, the regulable current source G1 is connected to the point P3 located between the signal transistor T5 and the cascode circuit K3 and K5. Therefore, the output of the DC current source G1 is additionally connected both to the source terminal of the cascode circuit K3 and K5 and to the drain terminal of the signal transistor T5. Furthermore, the DC current source G2 is also connected, at the point P4, to the source terminal of the cascode circuits K4 and K6 and the drain terminal of the signal transistor T6. A common-mode current regulation is thereby realized, a cascode changeover additionally being made possible. It is therefore possible to compensate for fluctuations caused in component terms by means of the DC current source G1 and G2 in the cascode circuits K1 to K6. The potential at the outputs O1 and O2 is furthermore kept constant by the regulation. In addition, different gains can be realized by means of the cascode circuit.

Figure 4:
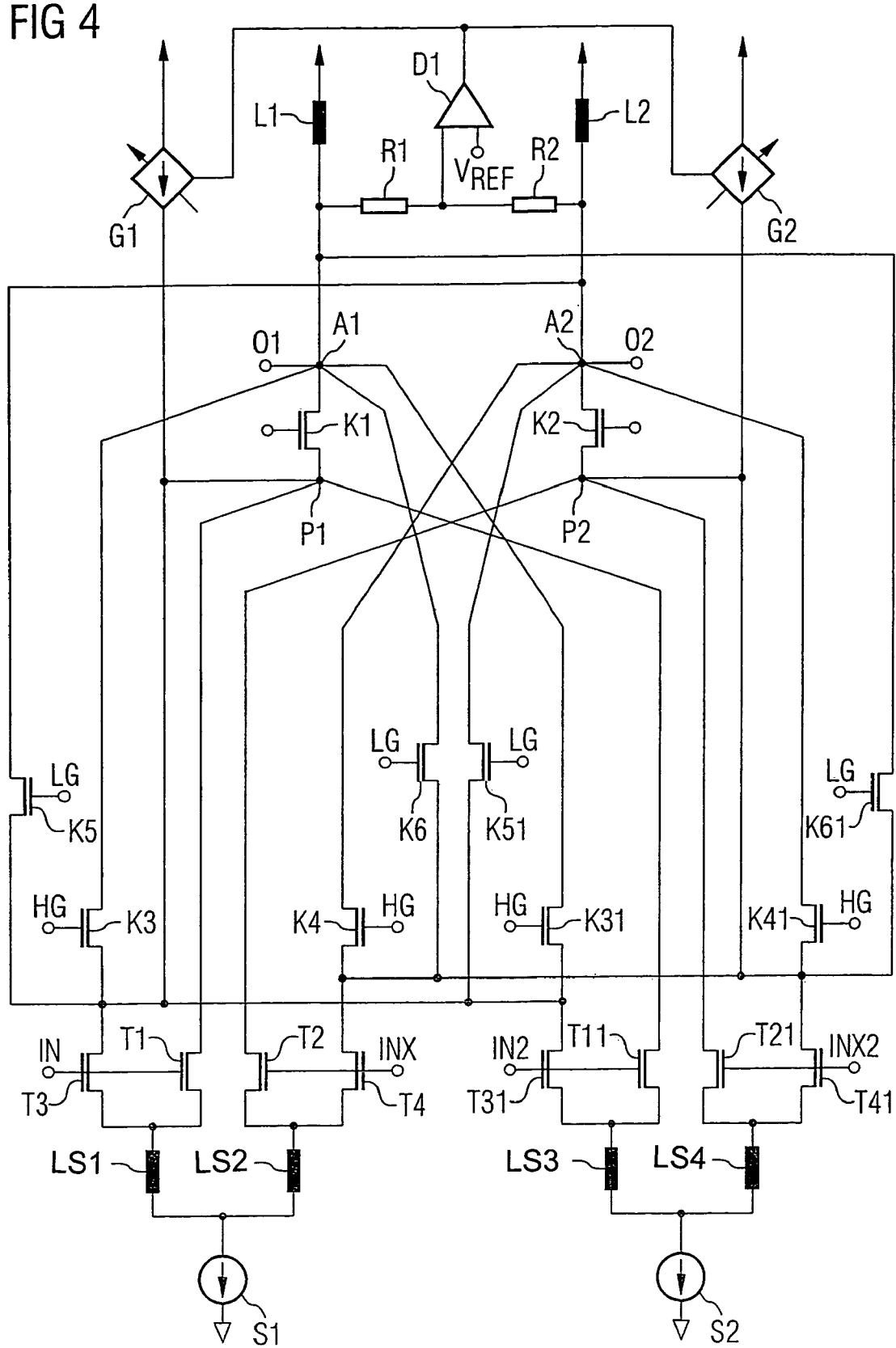
FIG. 4 shows a fourth aspect of the present invention.

FIG. 4 shows an exemplary aspect of a circuit which contains the concept of a push-pull current regulation in conjunction with cascode changeover with regard to a gain of the arrangement and the possibility of a dual band combination.

Here, too, identical components bear identical reference symbols. The circuit contains a first amplifier path for the first frequency band and a second amplifier path for the second frequency band. Each amplifier path is designed for changing over the gain by means of a cascode changeover. In order that a signal with a sufficient potential can be tapped off in each case at the outputs O1 and O2 of the differential amplifier arrangement, the current through the jointly utilized nonreactive resistors L1 and L2 can be controlled by the regulable current sources G1 and G2. For this purpose, the regulable current source G1 is connected by its output both to the node P1 and to the source terminal of the cascode circuit K3 and K5 and also K51 and K31 and to the drain terminal of the signal transistor T1 and of the signal transistor T31. Therefore, the regulable current source G1 is connected both to the right-hand and to the left-hand amplifier path. Moreover, the regulable current source G2 is both connected to the node P2 and connected to the source terminals of the cascode switches K4 and K6 of the first amplifier path and to the source terminal of the cascode switches K41 and K61 of the second amplifier path. The cascode switches K1 and K2 are furthermore jointly utilized cascode switches for both amplifier paths.

The differential amplifier arrangement according to the invention implements a regulating circuit that can be used to regulate the current through two nonreactive load resistors. The two nonreactive load resistors are connected into a respective amplifier path of the differential amplifier arrangement. In this case, a high DC bias current flows through a signal transistor whose control terminal carries the signal to be amplified. A part of said DC bias current is switched out by the regulable current source, so that only a small current flows through the load resistor within the amplifier path, so that the voltage dropped across it remains as low as possible.

The small-signal current that is generated by the signal transistor and is changed with respect to time is not influenced by the regulable current source. The load resistor within the amplifier path thus generates a small-signal output voltage corresponding to the gain at the output of the differential amplifier arrangement. Overall, it is not necessary to increase the supply voltage, as a result of which the power loss also remains low. The potentials at the output of the differential amplifier are measured in common-mode fashion and amplified in an operational amplifier, which generates a regulating signal and thus controls the regulable DC current sources. As a result, it is possible to compensate for a change in the DC bias current. In the exemplary embodiment illustrated here, the field-effect transistors are designed as n-channel type transistors. However, it is readily possible to realize the differential amplifier arrangement also with p-channel type field-effect transistors. It is likewise conceivable to replace field-effect transistors by bipolar transistors or to use a particular type of field-effect transistors. It is extremely simple to use the field-effect transistors in the exemplary embodiment with the opposite conductivity type. The exemplary embodiments of the differential amplifier arrangement that are illustrated here can be used in any desired combination and can be realized not only for input amplifiers but also in various other applications.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE SYMBOLS

| | |
|---|---|
| S1, S2: | Current sources |
| LS1, LS2, LS3, LS4 | Coils |
| T1, T2, . . . , T6: | Signal transistors |
| T31, T41; | Signal transistors |
| K1, K2, . . . , K6: | Cascode circuits |
| K31, K41, K51, K61: | Cascode circuits |
| L1, L2: | Nonreactive resistors |
| R1, R2: | Nonreactive resistors |
| A1, A2: | Taps |
| P1, P2: | Nodes |
| D1: | Operational amplifier |
| G1, G2: | Regulable current sources |
| IN, INX: | Input signals |
| IN2, INX2: | Input signals of the second amplifier |
| VC: | Cascode voltage |
| $V_{REF}$: | Reference potential |
| LG, HG: | Gain switching signals |
| VDD: | Supply potential |
| O1, O2: | Output |

What is claimed is:

1. A differential amplifier arrangement comprising:
   a current regulating circuit having a first and second control signal input terminals and a first signal output terminal;
   a DC current source;
   a first controllable path having a first terminal coupled to the DC current source and a control terminal coupled to the first signal input terminal;
   a second controllable path having a first terminal coupled to the DC current source and a control terminal coupled to the second control signal input terminal;
   a first load coupled by a first terminal via a first cascode circuit to a second terminal of the first controllable path and coupled by a second terminal to a supply potential;
   a second load coupled by a first terminal via a second cascode circuit to a second terminal of the second controllable path and coupled by a second terminal to the supply potential;
   a first tap between the first load and the first cascode circuit that is connected to the signal output terminal;
   a second tap between the second load and the second cascode circuit;
   a comparison mechanism having first and second inputs that outputs a control signal according to signals present on the first and second inputs, wherein the first input is coupled to the first tap and the second input is coupled to the second tap and the second input is operable to receive a reference signal;
   a regulable current source regulated by the control signal from the comparison mechanism having its current output connected to a second terminal of the first controllable path.

2. The differential amplifier arrangement of claim 1, further comprising a second signal output terminal coupled to the second tap.

3. The differential amplifier arrangement of claim 1, further comprising a second regulable current source regulated by the control signal of the comparison mechanism having its current output connected to a second terminal of the second controllable path.

4. The differential amplifier arrangement of claim 1, further comprising a third and fourth load, wherein first terminals of the third and fourth load are coupled to the first input of the comparison mechanism, a second terminal of the third load is coupled to the first tap and a second terminal of the fourth load is connected to the second tap.

5. The differential amplifier arrangement of claim 1, wherein the comparison mechanism is a differential amplifier.

6. The differential amplifier of claim 4, wherein the first, second, third and fourth loads are nonreactive resistors.

7. The differential amplifier of claim 1, further comprising:
  a second regulable current source regulated by the control signal of the comparison mechanism;
  a third controllable path coupled by a first terminal to the second current source, a second terminal coupled to the second terminal of the first controllable path, and a third signal input; and
  a fourth controllable path coupled by a first terminal to the second current source, a second terminal coupled to the second terminal of the second controllable path, and a fourth signal input.

8. The differential amplifier of claim 7, wherein the first and second current sources are designed as an identical current source.

9. The differential amplifier of claim 1, further comprising:
  a fifth controllable path and a third cascode circuit connected in series therewith, wherein a first terminal of the fifth controllable path is coupled to the first current source, a control terminal of the fifth controllable path is coupled to the control terminal of the first controllable path, the first tap is coupled to the third cascode circuit; and
  a sixth controllable path and a fourth cascode circuit connected in series therewith; wherein a first terminal of the sixth controllable path is coupled to the first current source, a control terminal of the sixth controllable path is coupled to the control terminal of the second controllable path, the second tap is coupled to the fourth cascode circuit.

10. The differential amplifier arrangement of claim 9, further comprising:
  a fifth cascode circuit having a first terminal coupled to the fifth controllable path and the third cascode circuit and a second terminal to the second tap; and
  a sixth cascode circuit having a first terminal coupled to the sixth controllable path and the fourth cascode circuit and a second terminal to the first tap.

11. The differential amplifier arrangement of claim 10, wherein input resistances of the first and fifth controllable paths have the same ratio as input resistances of the first and third cascode circuits.

12. The differential amplifier arrangement of claim 1, wherein the first cascode circuit comprises a field-effect transistor.

13. A method for operating a differential amplifier arrangement comprising:
  providing a current source, at least one input signal transistor coupled thereto and a load coupled in series therewith,
  measuring output signals in common mode fashion and comparing the measured output signals with a reference signal;
  generating a control signal according to the comparison of the measured output signals and the reference signal;
  using the generated control signal to control a DC current of a regulable current source;
  adjusting the reference signal to obtain a voltage swing of the output signal; and
  providing the DC current to the at least one input signal transistor and the load.

14. The method of claim 13, further comprising generating the output signals.

15. A differential amplifier arrangement comprising:
  a DC current source;
  a first portion comprising:
    a first controllable path having a first terminal coupled to the DC current source, a second terminal, and a control terminal that receives a first input signal;
    a first cascode circuit having a first terminal coupled to the second terminal of the first controllable path and a second terminal that provides a first output signal; and
    a first regulable current source having an output coupled to the first terminal of the cascode circuit and that is regulated according to a control signal;
  a second portion comprising:
    a second controllable path having a first terminal coupled to the DC current source, a second terminal, and a control terminal that receives a second input signal;
    a second cascode circuit having a first terminal coupled to the second terminal of the second controllable path and a second terminal that provides a second output signal; and
    a first regulable current source having an output coupled to the first terminal of the second cascode circuit and that is regulated according to the control signal; and
  a control circuit coupled to the second terminal of the first cascode circuit and the second terminal of the second cascode circuit and that generates the control signal according to the first output signal generated at the second terminal of the first cascode circuit and the second output signal generated at the second terminal of the second cascode circuit.

16. The differential amplifier arrangement of claim 15, wherein the first controllable path is a FET n-type transistor.

17. The differential amplifier arrangement of claim 15, wherein the control circuit comprises a differential amplifier having a first input terminal coupled to the second terminal of the first cascode circuit, a second input terminal that receives a reference voltage, and an output that provides the control signal.

18. The differential amplifier arrangement of claim 15, further comprising:
  a third portion comprising:
    a third controllable path having a first terminal coupled to the DC current source, a second terminal, and a control terminal that receives a third input signal; and
    a third cascode circuit having a first terminal coupled to the second terminal of the third controllable path and to the output of the first regulable current source and a second terminal that provides a third output signal and is coupled to the control circuit;
  a fourth portion comprising:
    a fourth controllable path having a first terminal coupled to the DC current source, a second terminal, and a control terminal that receives a fourth input signal; and
    a fourth cascode circuit having a first terminal coupled to the second terminal of the fourth controllable path and to the output of the second regulable current source and a second terminal that provides a fourth output signal and is coupled to the control circuit;

wherein the control circuit generates the control signal according to the first, second, third, and fourth output signals; and wherein the first and third output signals comprise a first output band and the second and fourth output signals comprise a second output band having a different frequency band than the first output band.

19. The differential amplifier of claim 18, wherein the first portion, the second portion, the third portion, and the fourth portion further comprise gain control mechanisms that selectably adjust gain.

* * * * *

UNITED STATES PATENT AND TRADEMARK OFFICE
CERTIFICATE OF CORRECTION

PATENT NO. : 7,095,281 B2  Page 1 of 1
APPLICATION NO. : 10/949432
DATED : August 22, 2006
INVENTOR(S) : Josef Zipper, Werner Schelmbauer and Claus Stöger It is certified that error appears in the above-identified patent and that said Letters Patent is hereby corrected as shown below:

On Title page
Page 1, (73) Assignee:   Please change the letters "Ag" to --AG--.

Item (73)    Assignee:   Infineon Technologies AG, Munich (DE)

Signed and Sealed this

Thirteenth Day of February, 2007

JON W. DUDAS
*Director of the United States Patent and Trademark Office*